US006759903B2

(12) United States Patent
Horimoto

(10) Patent No.: US 6,759,903 B2
(45) Date of Patent: Jul. 6, 2004

(54) AMPLIFIER

(75) Inventor: Masashi Horimoto, Kyoto (JP)

(73) Assignee: Rohm Co., Ltd., Kyoto (JP)

(*) Notice: Subject to any disclaimer, the term of this patent is extended or adjusted under 35 U.S.C. 154(b) by 27 days.

(21) Appl. No.: 10/147,212

(22) Filed: May 15, 2002

(65) Prior Publication Data

US 2002/0171488 A1 Nov. 21, 2002

(30) Foreign Application Priority Data

May 18, 2001 (JP) .................................... 2001-150185

(51) Int. Cl.[7] ............................................. H03F 3/45
(52) U.S. Cl. ..................... 330/253; 330/264; 330/269
(58) Field of Search ................................. 330/253, 263, 330/264, 269, 261; 327/328, 359

(56) References Cited

U.S. PATENT DOCUMENTS

| 5,371,474 A | * | 12/1994 | Wassenaar et al. ......... 330/253 |
| 5,631,607 A | * | 5/1997 | Huijsing et al. ............ 330/253 |
| 5,714,906 A | * | 2/1998 | Motamed et al. ........... 327/563 |
| 6,124,760 A | * | 9/2000 | Hong ........................... 330/253 |

* cited by examiner

Primary Examiner—Khanh Van Nguyen
(74) Attorney, Agent, or Firm—Hogan & Hartson

(57) ABSTRACT

An amplifier has a p-type and an n-type difference transistor pairs providing respective outputs, and is adapted to provide the outputs of the pairs in an integrated form. When the level of the input signal is below a predetermined level, only the p-type difference transistor pair is activated, and when the level of the input signal is higher than the predetermined level, the n-type difference transistor pair is also activated. The amplifier has an expanded dynamic range with a suppressed noise level.

10 Claims, 5 Drawing Sheets

AMPLIFIER

FIELD OF THE INVENTION

The invention relates to an amplifier having a difference amplification circuit formed on a semiconductor IC chip for amplifying analog signals.

BACKGROUND OF THE INVENTION

Current operational amplifiers having a difference amplifier circuit for amplifying analog signals are formed on semiconductor IC chips for use in such audio apparatus as voice codics, Hi-Fi audios, and cellular phones.

In an operational amplifier, a difference amplifier circuit includes a pair of p-channel MOSFETs (hereinafter referred to as p-type transistors) or a pair of n-channel MOSFETs (hereinafter referred to as n-type transistors). However, either type of difference pairs of transistors, incorporating p-type or n-type, has only a limited dynamic range for a given input signal, either in the upper or lower range of the signal. Hence, if a wide dynamic range is required, difference pairs of p-type and n-type transistors (referred to as p-type and n-type difference transistor pairs, respectively) are used to couple respective dynamic ranges of the pairs.

FIG. 1 shows a conventional operational amplifier circuit having both types of difference transistor pairs. FIG. 2 shows a use of an operational amplifier OP as shown in FIG. 1.

In the operational amplifier shown in FIG. 1, a p-type transistor M11 having a gate and a drain connected together and a constant current power supply 11 are connected in series between a voltage supply Vdd and ground potential Gnd. The constant potential of the node of the p-type transistor M11 and the constant current source 11 is supplied to the gate of a p-type transistor M12 to place the p-type transistor M12 in operation under the constant current from the constant current source 11. Similarly, connected in series between the power supply potential Vdd and the ground Gnd are a p-type transistor M13 having a gate and a drain connected together and a constant current source 12. The constant potential of the node of the transistor M13 and the current source 12 is supplied to the gate of a p-type transistor M14 to place the p-type transistor M14 in operation under the constant current from the constant current source 12.

A p-type difference transistor pair Pd is formed of a p-type transistor M15 having an inverting input terminal for receiving a signal Vinn (which signal will be referred to as inverting signal) and another p-type transistor M16 having a non-inverting terminal for receiving a positive phase signal Vinp. The p-type difference transistor pair Pd is connected in series with the p-type transistor M12. Connected as a load to this p-type difference transistor pair Pd is a current mirror circuit which is made up of one n-type transistor M17 and another n-type transistor M18. In the current mirror circuit, the gate of the n-type transistor M17 is connected with the drain of the same transistor M17 and with the drain of the p-type transistor M15 and the gate of the n-type transistor M18.

The drain of the n-type transistor M18 is connected with the drain of the p-type transistor M16 and the gate of the n-type transistor M19 which is connected in series with the p-type transistor M14 between the power supply potential Vdd and the ground potential Gnd. The n-type transistor M19 provides an output potential Vout at the drain thereof. An anti-oscillation resistor Ro and condenser Co are connected between the gate and the drain of the n-type transistor M19. The circuit arrangement mentioned above constitutes an amplifier circuit associated with the p-type difference transistor pair.

On the other hand, an amplifier circuit associated with an n-type difference transistor pair is established as follows. Connected in series between the power supply potential Vdd and the ground potential Gnd are a constant current source 21 and an n-type transistor M28. The node of the constant current source 21 and the n-type transistor M28 is supplied to the gate of an n-type transistor M27 to drive the n-type transistor M27 at constant current.

The n-type transistor M25 to which the positive phase signal Vinp is input and the n-type transistor M26 to which the signal Vinn is input together constitute an n-type difference transistor pair Nd, which is connected in series with the n-type transistor M27. Connected as a load to the n-type difference transistor pair is a p-type transistor M22 having its drain and gate connected with each other. In addition, a p-type transistor M21 is provided which has a gate connected to the gate of the p-type transistor M22 and a drain connected to the drain of the n-type transistor M17. The drain of the n-type transistor M26 is connected with a p-type transistor M23 having its drain connected with its gate. Further, a p-type transistor M24 is provided which has a gate connected with the gate of the p-type transistor M23 and a drain connected with the n-type transistor M18.

The operational amplifier OP thus formed is fed at the non-inverting input (+) terminal with a positive phase signal Vinp which is obtained by superposing a bias voltage Vb on an input signal Vin, and at the inverting input (−) terminal with an inverting input signal Vinn from the output end of the amplifier, as shown in FIG. 2. This arrangement constitutes a voltage follower.

In this conventional operational amplifier, both the amplifier circuit in the p-type difference transistor pair Pd and the amplifier circuit in the n-type difference transistor pair Nd are always in operation. Hence, if the level of the positive phase signal Vinp becomes so high that its amplification by the p-type difference transistor pair Pd is limited, amplification by the amplifier circuit in the n-type difference transistor pair Nd will not be limited, thereby resulting in an unlimited amplification of the input signal Vinp. If on the other hand the level of the positive phase signal Vinp becomes so low that its amplification by the amplifier circuit in the n-type difference transistor pair Nd is limited-, its amplification by the amplifier circuit in the p-type difference transistor pair Pd is not limited, allowing unlimited amplification of the input signal in the low range. Thus, by the concurrent use of both types of difference transistor pairs Nd and Pd, the overall dynamic range of the amplifier can be expanded.

However, in such conventional amplifier as mentioned above, noise characteristics are significantly worse than an amplifier including a p-type difference transistor pair Pd.

A reason for this is that n-type transistors have worse 1/f noise characteristics than p-type transistors. "1/f noise" refers to noise having a 1/f dependence in the spectrum where f is the frequency, which is mainly due to flicker noises dominant in the output spectrum.

Therefore, a tradeoff for an expanded dynamic range by means of both types of difference transistor pairs is an increment of noises. In order to suppress 1/f noise, the sizes (channel lengths and/or channel widths) of the transistors may be enlarged, which however inevitably results in an increase in the area occupied by the amplifiers on the IC chip and hence the cost of the IC chip.

SUMMARY OF THE INVENTION

It is therefore an object of the invention to provide an improved amplifier having difference transistor pairs which provide an expanded dynamic range with a suppressed noise level.

In accordance with one aspect of the invention, there is provided an amplifier, comprising;

a first amplifier circuit having a difference pair of: transistors having a first conduction-type (said pair referred to as difference transistor pair of the first conduction-type) for amplifying an input signal to provide a first output signal;

a second amplifier circuit having a difference pair of transistors having a second conduction-type (said pair referred to as difference transistor pair of the second conduction-type) for amplifying said input signal to provide a second output signal, wherein only said first amplifier circuit is activated when the level of said input signal is lower than a predetermined level and said first and second amplifier circuits are activated when the level of said input signal is higher than said predetermined level; and said amplifier is adapted to output said first and second output signals in an integrated form.

In accordance with another aspect of the invention, there is provided an amplifier, comprising;

a first amplifier circuit having a difference transistor pair of the first conduction-type for amplifying an input signal to provide a first output signal;

a second amplifier circuit having a difference transistor pair of the second conduction-type for amplifying said input signal to provide a second output signal;

a controller adapted to activate said second amplifier circuit when the level of said input signal is higher than a predetermined level and inactivate said second amplifier circuit when the level of said input signal is lower than said predetermined level; and an output circuit for outputting said first and second output signals in an integrated form.

In this arrangement, only the first amplifier circuit of the first difference pair which has negligibly small 1/f noise is activated when the level of the input signal is lower than the predetermined level, thereby generating suppressed noise. When the input signal has a higher level than the predetermined level, the second amplifier of the second difference pair is activated to provide an expanded dynamic range.

The controller may be configured to set up the predetermined level which corresponds to the limiting amplification level of the first amplifier circuit. In this case, the first and the second amplifier circuits are selectively activated in accordance with whether the level of the input signal is greater or smaller than the predetermined level.

The controller may be configured to set up the predetermined level below the limiting amplification level of the first amplifier circuit. In this case, the operational ranges of the first and the second amplifier circuits overlap each other that there will be no discontinuity in the amplification, and hence no abrupt change in the output signal.

The controller is formed of the same type of transistors forming the first difference transistor pair, and made operable under the same operating conditions as the first difference pair, but it may have different physical dimensions.

The transistors forming the difference transistor pair of the first conduction-type may be p-type MOSFETs while the transistors forming the difference transistor pair of the second conduction-type may be n-type MOSFETs. Alternatively, the transistors forming the difference transistor pair of the first conduction-type may be pnp-type bipolar transistors while the transistors forming a difference transistor pair of the second conduction-type may be npn-type bipolar transistors.

DETAILED DESCRIPTION OF THE PREFERRED EMBODIMENT

Figure 3:
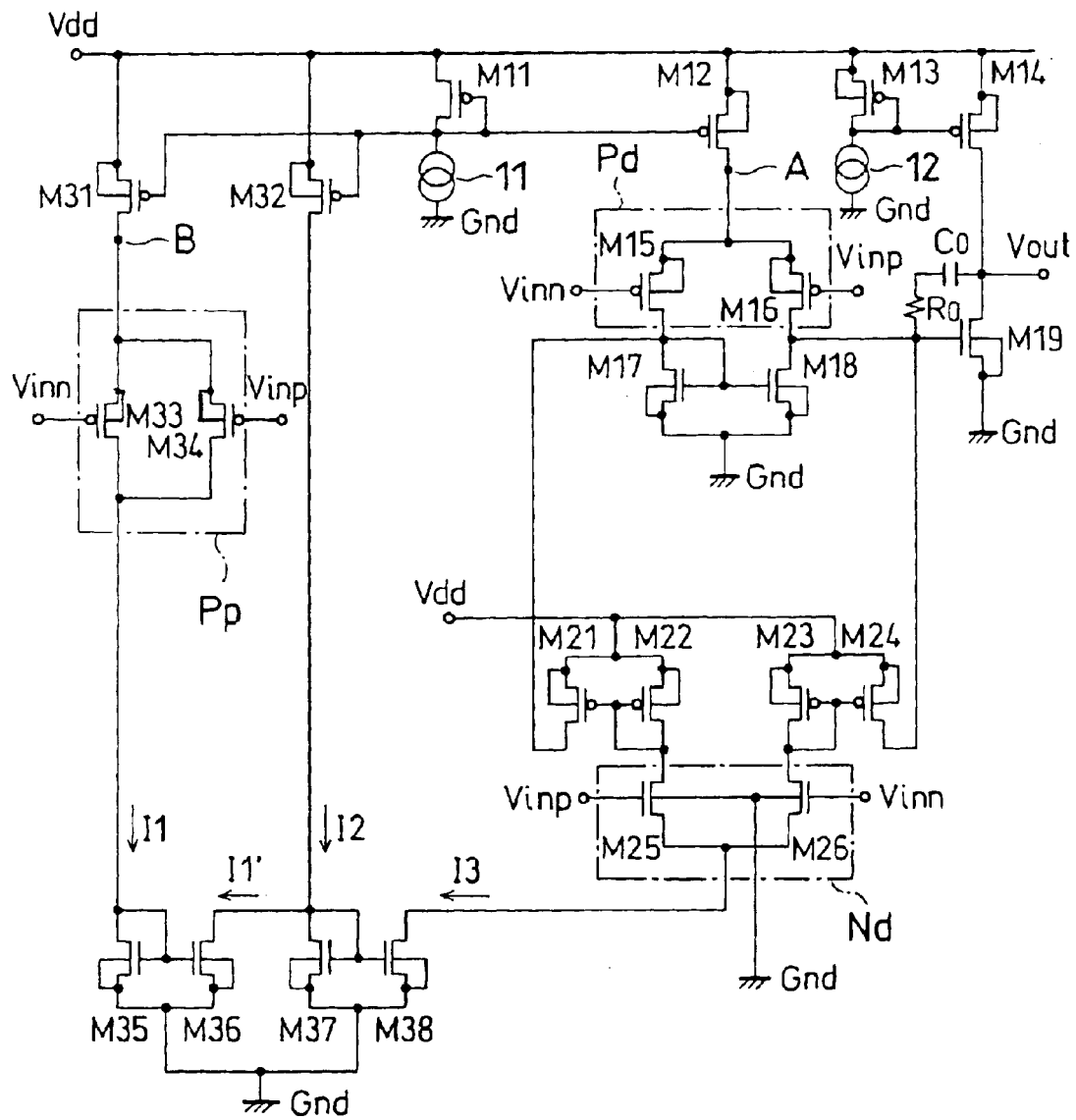
FIG. 3 is a circuit diagram of an operational amplifier according to the invention.

Referring to FIG. 3, there is shown an operational amplifier according to the invention, constructed in the form of a transistor IC chip.

Figure 1:
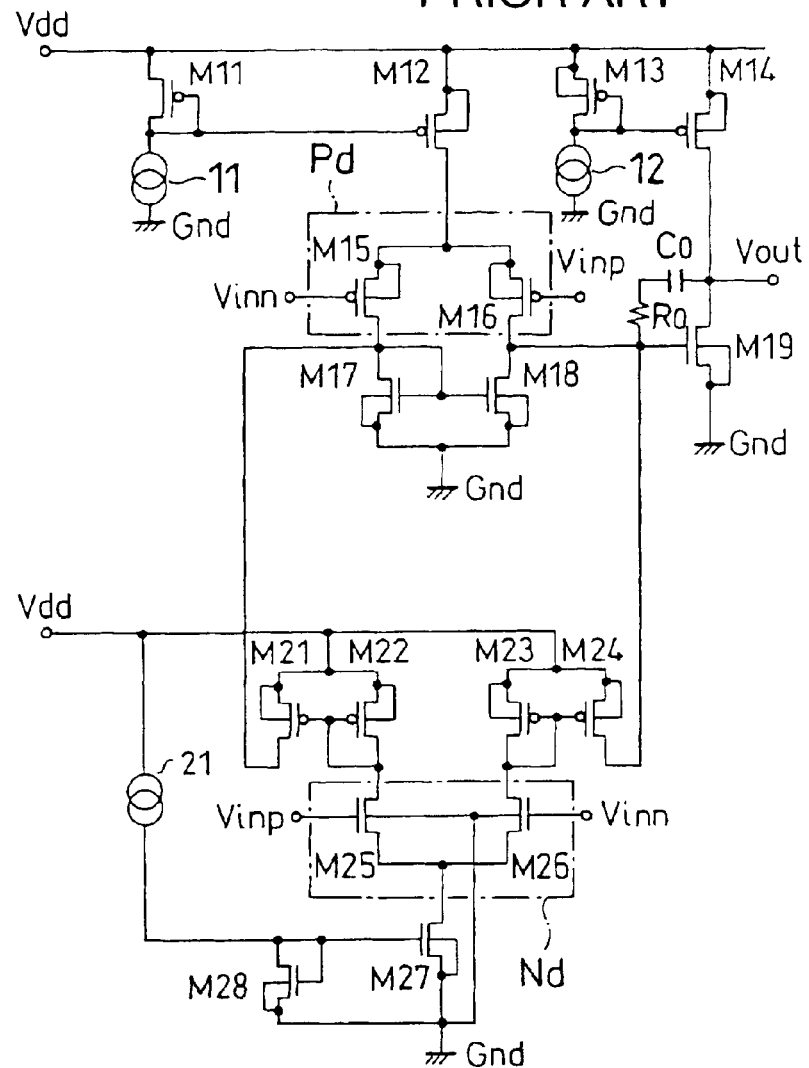
FIG. 1 is a circuit diagram of a conventional operational-amplifier.

Like reference numerals in FIGS. 1 and 3 indicate like components. Thus, p-type and n-type transistors M11–M19, constant current sources 11 and 12, condenser Co, resistor Ro, p-type and n-type transistors M21–M26 shown in FIG. 3 are the same as those shown in FIG. 1, and connected in the same way as in FIG. 1.

N-type transistors M27 and M28 and constant current source 21 of FIG. 1 are deleted from the amplifier shown in FIG. 3.

On the other hand, p-type and n-type transistors M31–M38 are added to the controller of FIG. 3. The p-type transistors M31 and M32 have their sources connected with the constant voltage source Vdd and gates connected with the drain of the p-type transistor M11 having a constant potential, so that they function as constant current sources. Currents passing through the p-type transistor M31 and the p-type transistor M32 are designated as I1 and I2, respectively.

The p-type transistors M33 and M34 have their sources connected together and drains connected together to form a p-type parallel transistor pair Pp (hereinafter referred to as p-type parallel transistor pair Pp or simply parallel pair Pp). The sources of the parallel pair Pp are connected with the drain of the p-type transistor M31.

The gates of the p-type transistors M33 and M34 are supplied with the same positive phase input signal Vinp and the same inverting input signal Vinn, respectively, as supplied to the p-type difference transistor pair. Consequently, when the p-type transistors M33 and M34 are made to have the same size as the p-type transistors M15 and M16 forming the difference pair Pd, the parallel pair Pp operates in the same way as the p-type difference transistor pair Pd. Utilizing this feature of the operational amplifier that the p-type difference transistor pair Pd and the p-type parallel transistor pair Pp behave in the same manner, limiting amplification level of the difference transistor pair Pd can be detected by monitoring the operation of the parallel transistor pair Pp.

The p-type transistors M33 and M34 forming the p-type parallel transistor pair Pp can be made different in size from the p-type transistors M15 and M16 forming the p-type difference transistor pair Pd so that the parallel pair Pp has a different limiting amplification level from that of the difference pair Pd. For example, the limiting amplification level of the parallel pair Pp can be lower than that of the difference pair Pd. In this case, the parallel pair Pp can be turned off at a lower potential level than the difference pair Pd.

The gates of n-type transistors M35 and M36 are connected together and the drain and the gate of the transistors M35 are connected together to form a current mirror circuit. Since the drain of the n-type transistor M35 is connected with the drains of the p-type transistors M33 and M34, the same currents I1 flow through the n-type transistors M35 and M36.

The gates of the n-type transistors M37 and M38 are connected together and the drain and the gate of the n-type transistor M37 are connected with each other so that these transistors form a current mirror circuit. Since the drain of the n-type transistor M37 is connected with the drains of the p-type transistor M32 and n-type transistor M36, a constant current I2 provided by the p-type transistor M32 (constant current source) flows through the n-type transistor M36 or the n-type transistor M37. Thus, the same current flows through the n-type transistors M38 and M37.

The drain of the n-type transistor M38 is connected with the sources of the n-type transistors M25 and M26 of the n-type difference transistor pair Nd. As a result, n-type difference transistor pair Nd becomes operative or inoperative depending on whether the n-type transistor M38 is activated or not. Incidentally, all of the transistors in the current mirror circuits described above are assumed to have the same operational characteristics.

Figure 4:
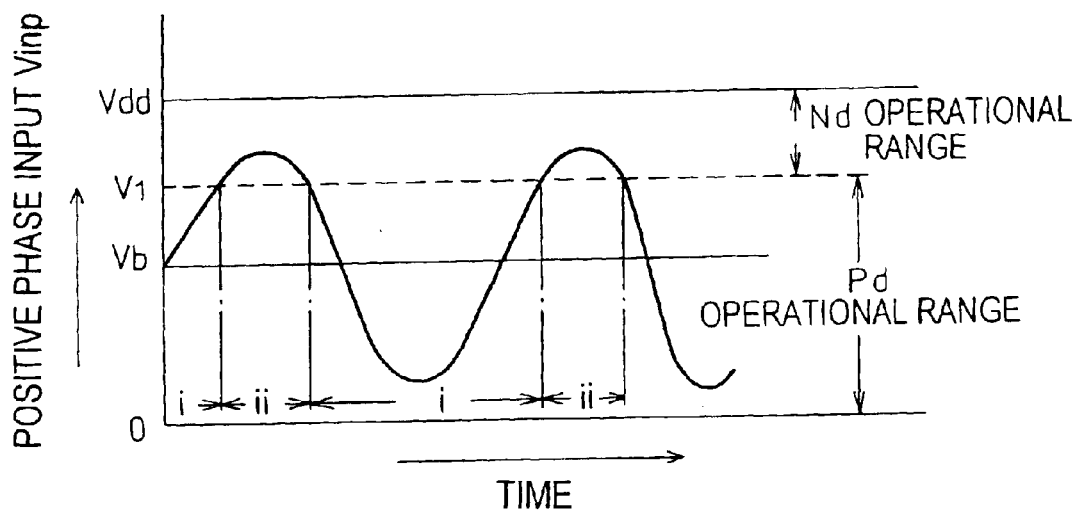
FIGS. 4(a) and (b) are graphical representations of the operation of the operational amplifier shown in FIG. 3.
Figure 4:
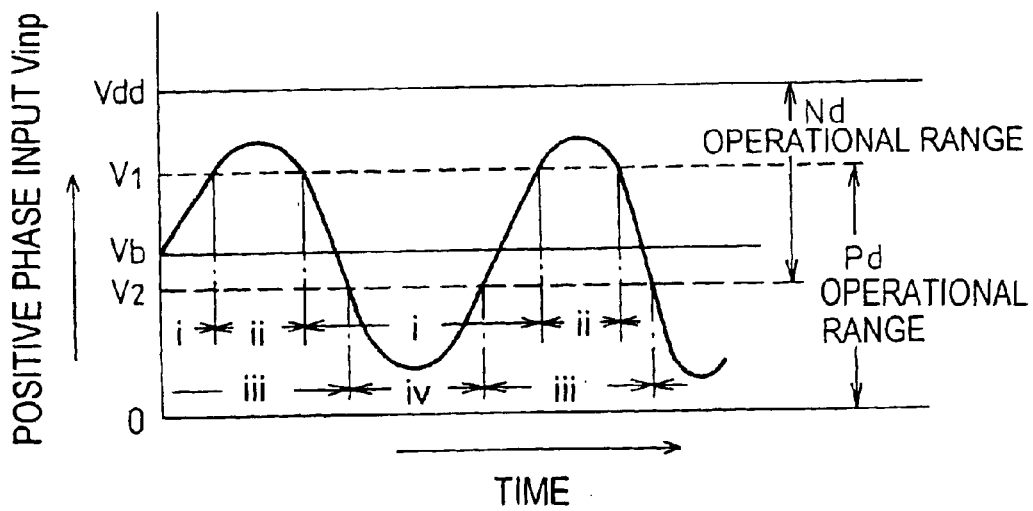

Referring to FIGS. 4(a) and (b), operation of the amplifier of the invention as shown in FIG. 3 will now be described. FIG. 4(a) is a graphical representation of the amplification by the parallel pair Pp with its limiting amplification level set identical to that of the difference pair Pd. FIG. 4(b) is a graphical representation of the amplification by the p-type parallel pair Pp when its limiting amplification level is set lower than that of the p-type difference pair Pd.

Figure 2:
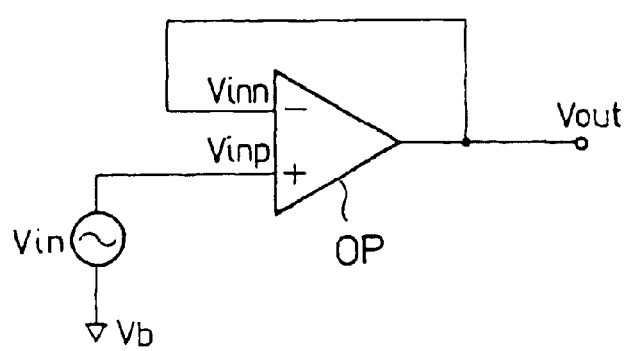
FIG. 2 illustrates use of an operational amplifier.

It is assumed here that a positive phase input signal Vinp which is obtained by superposing a source signal Vin on the bias voltage Vb is fed to the non-inverting input terminal of the operational amplifier OP shown in FIG. 3, and that the output potential Vout is fed as the inverting input signal Vinn, establishing a voltage follower, as is the case shown in FIG. 2. This configuration of the operational amplifier may be applied not only to the voltage follower but also to other types of circuits.

An example will now be described in which the limiting amplification level of the parallel transistor pair Pp is set identical to that of the p-type difference transistor pair Pd.

As shown in FIG. 4(a), when the level of the positive phase input signal Vinp is lower than a predetermined level V1 (as in time intervals i), the p-type transistor M12 is in constant current operation. Consequently, the p-type difference transistor pair Pd, cooperating with the n-type transistors M17 and M18 of the current mirror circuit, provides an output Vout in accordance with the positive phase input signal Vinp.

In the time intervals i, the p-type transistors M33 and M34 of the parallel pair Pp are left conductive, and the p-type transistors M31 and M32 are in constant current operation. The current I1 from the p-type transistor M31 flows through the n-type transistor M36, so that current I1' equals I1 (I1=I1'). The current I2 through the p-type transistor M32 is set equal to the current I1, the current I2 is entirely absorbed by the n-type transistor M36. Consequently, the gate voltage of the n-type transistor M37 is lowered, so that no current will flow through the n-type transistor M37. Hence, no current flows through the n-type transistors M37 and M38 in the current mirror circuit. That is, I3=0, and the amplifier circuit in the n-type difference transistor pair Nd is inactivated.

In this manner, when the level of the positive phase input signal Vinp is lower than the predetermined level V1, the amplifier circuit in the n-type difference transistor pair Nd is rendered inoperative, and allows only the amplifier circuit in the p-type difference transistor pair Pd to operate. Therefore, overall noise level is reduced accordingly, since the n-type difference transistor pair that can generate large 1/f noise is not in operation. Further, since the amplifier circuit in the p-type difference transistor pair Pd remains operative even when the positive phase input signal Vinp has a low level, amplification by the entire amplifier is not limited by the predetermined level V1 in the low operational range, and a full dynamic range is secured.

Next, suppose that the level of the positive phase input signal Vinp rises from a low to a higher level. When the sum of Vinp, the threshold voltage Vth(m16) of the p-type transistor M16, and the saturation voltage Vsat(m12) of the p-type transistor M12 exceeds the power supply potential Vdd:

$$Vinp+Vth(m16)+Vsat(m12) \geq Vdd,$$

the p-type transistor M12 can no longer maintain its constant current operation. Consequently, the p-type difference transistor pair Pd stops its operation. In other words, in order to allow the p-type transistor M12 to operate as a constant current source, node A must have a lower potential than the power supply potential Vdd by a certain amount. The limiting level V1 of the positive input signal Vinp at which the p-type difference transistor pair Pd becomes inoperative is defined to be the limiting amplification level of the amplifier associated with the p-type difference transistor pair Pd.

The positive phase input signal Vinp and the inverting input signal Vinn are also supplied to the gates of the p-type transistors M33 and M34 of the parallel transistor pair Pp. In the example shown herein, the same limiting amplification level V1 is set for the p-type transistors M33 and M34 of the parallel transistor pair Pp and for the p-type transistors M15 and M16 of the p-type difference transistor pair Pd. Hence, at the moment when the positive phase signal Vinp has acquired the level V1, the p-type transistors M33 and M34 of the parallel transistor pair Pp are turned off. Then the current I1 of the n-type transistor M35 and the current I1' of the n-type transistor M36 become zero. This causes the current I2 to flow through the n-type transistor M37 and current I3 to flow through the n-type transistor M38 because of the current mirroring configuration.

The constant current I3 of the n-type transistor M38 is the operational current of the amplifier of the n-type difference pair Nd undergoing amplification. This operation takes place in the time intervals ii shown in FIG. 4(a). That is, only the amplifier of the p-type difference transistor pair Pd is operable during the time intervals i when the positive phase signal Vinp has a lower level than the predetermined level V1. As the level of the positive phase signal Vinp exceeds the level V1 as in time interval ii, switching of the amplifier takes place, that is, the amplification by the positive difference pair Pd is taken over by the negative difference pair Nd.

Since the amplifier of the n-type difference transistor pair Nd is not limited by the level V1, amplification of the signal exceeding V1 can be amplified still by the pair Nd, so that the dynamic range of the amplifiers as a whole is not limited, resulting in an expanded input dynamic range. It should be appreciated that the signal-to-noise (S/N) ratio always remains low because the n-type difference transistor pair Nd having influential 1/f noise operates only during periods when the level of the input signal are exceedingly large. In addition, since the amplifier of the n-type difference transistor pair Nd is in operation only in such limited time intervals as described above, power consumption by the amplifier is nullified during the time intervals where the positive phase input signal Vinp is relatively low.

In actuality switching of the amplifiers of the p-type difference pair Pd and n-type difference pair Nd is smooth (not abrupt) and so is the output potential Vout, since the currents through them change smoothly.

Figure 5:
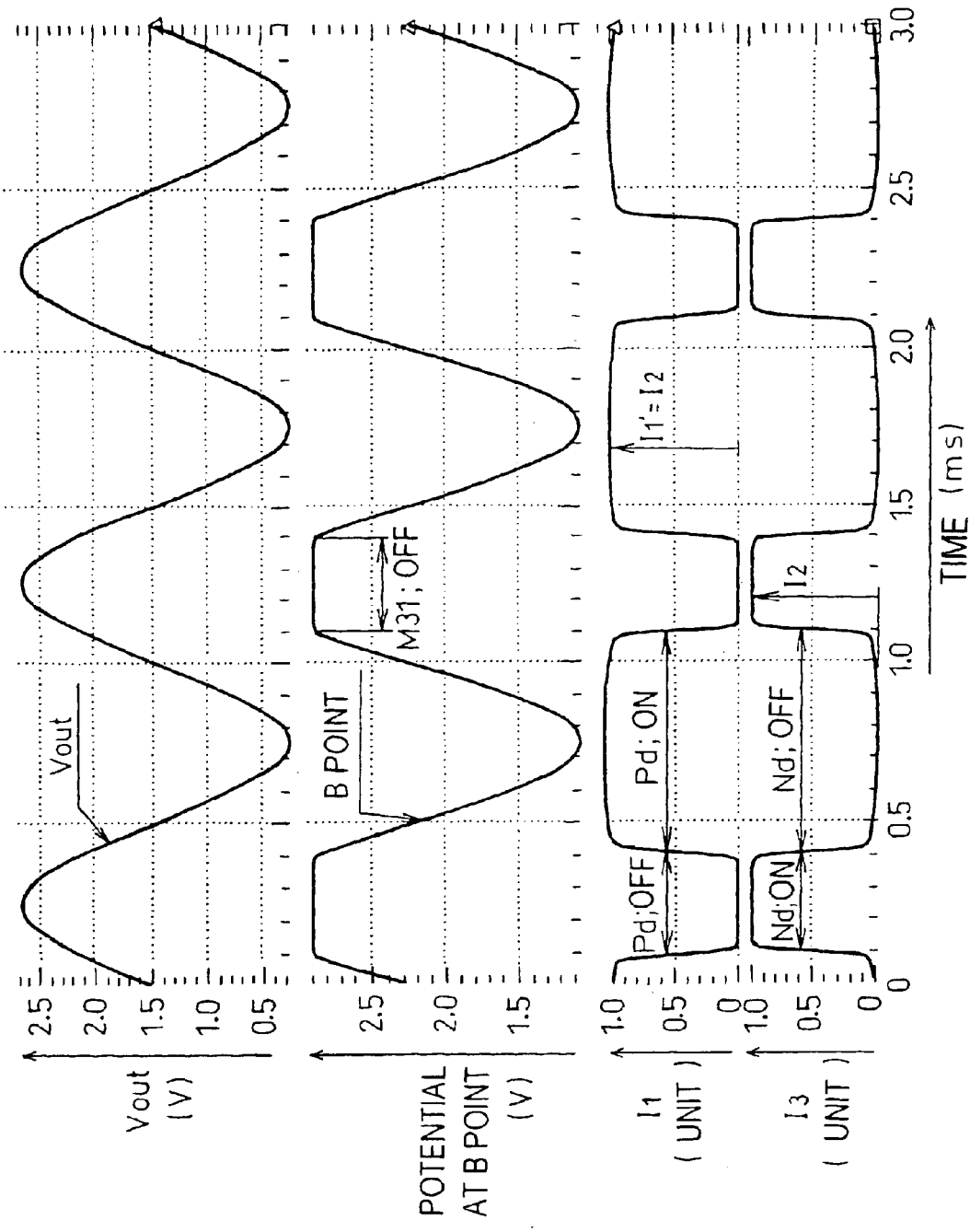
FIG. 5 shows waveforms appearing at different nodes of the operational amplifier of the invention.

Waveforms that appear at the node B at various stages of amplification are depicted in FIG. 5. The abscissas of diagrams of FIG. 5 represent time on the same scale. The three diagrams show respectively the output potential Vout, B-node potential or the common source potential of the p-type transistors M33 and M34 of the pair Pp, and current I3 flowing through the n-type transistors M35 and M38. It is seen from FIG. 5 that B-node potential is clipped at a level close to the power supply potential Vdd, and that when this clipping takes place the currents I1 and I3 are changed in a complementary manner. Thus, during a time interval when B-node potential is clipped, the current I1 is reduced to zero while the current I3 is stepped up to the constant level I2, thereby turning on the n-type difference transistor pair Nd and turning off the p-type difference transistor pair Pd. On the other hand, during a time interval when the B-point potential is not clipped, the current I1 flows normally, but the current I3 is nullified, thereby turning on the p-type difference transistor pair Pd and off the n-type difference transistor pair Nd.

Figure 6:
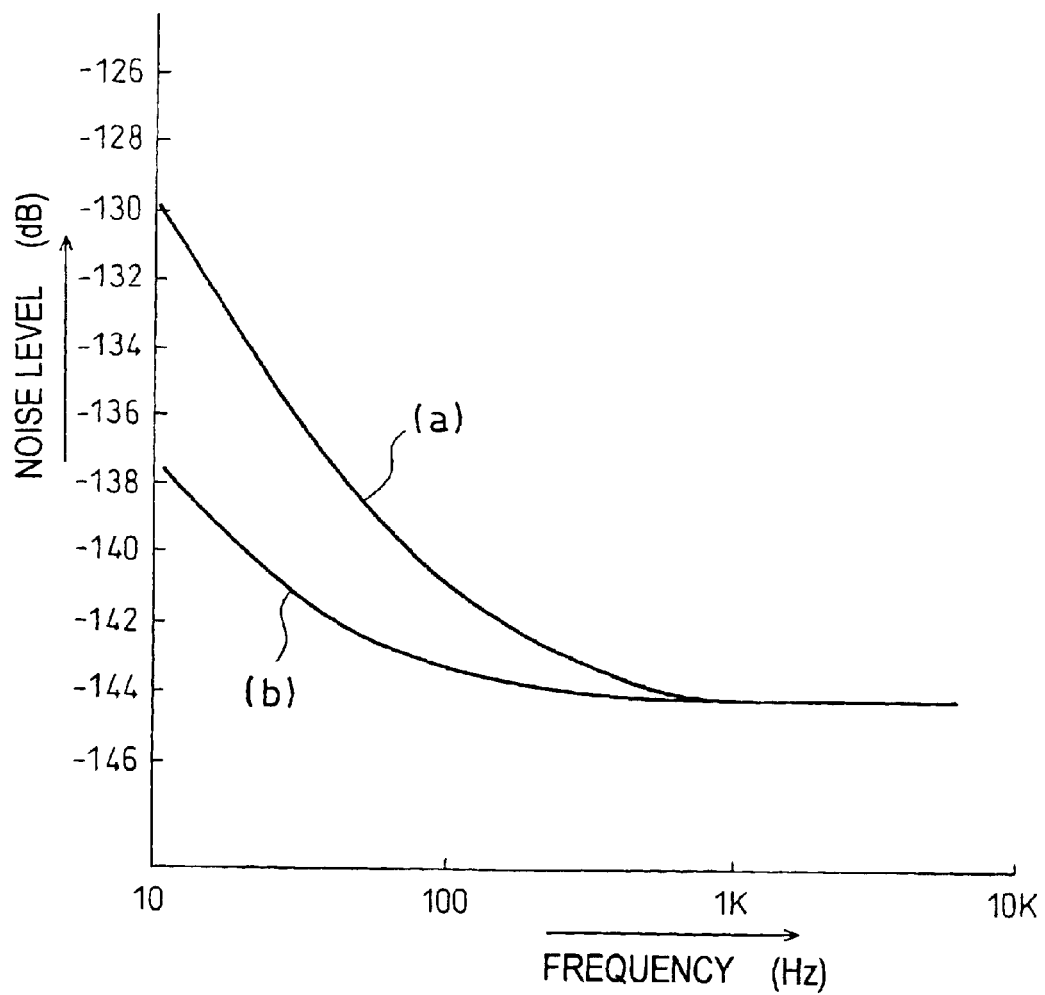
FIG. 6 is a graphical representation of frequency-noise level characteristic of a conventional and an inventive operational amplifiers.

FIG. 6 shows plots of noise levels (in dB) of a conventional amplifier (a) and an inventive amplifier (b) as a function of logarithmic frequency, illustrating the frequency versus noise level characteristics of the amplifiers. It is seen in FIG. 6 that the 1/f noise level can be greatly reduced in the invention as compared with the conventional amplifier. For example, the noise is reduced by about 8 dB at 10 Hz.

If a further reduction of 1/f noise is required, it is only necessary to enlarge the size of the transistors in the p-type difference transistor pair Pd, which is an advantage from the point of saving a circuit area.

Referring again to FIG. 4(b), operation of the amplifier shown in FIG. 3 will be described for a case where the limiting amplification level V2 of the p-type parallel transistor pair Pp is set lower than the limiting amplification level V1 of the p-type difference transistor pair Pd.

In this case, the p-type transistors M33 and M34 of the pair Pp are configured to have amplification characteristics such that the limiting amplification level V2 of the parallel pair Pp is a little lower than the limiting amplification level V1 of the difference pair Pd. This can be done for example, by constructing the p-type transistors M33 and M34 of the parallel pair Pp differing in size from the p-type transistors M15 and M16 of the difference pair Pd.

The p-type transistors M33 and M34 thus formed will be turned off at the moment when the positive phase signal Vinp reaches the limiting amplification level V2 of the parallel pair Pp. This nullifies the respective current I1 and I1' flowing through the n-type transistors M35 and M36. As a result, constant current I2 will flow through the n-type transistor M37, which in turn causes constant current I3 to flow through the n-type transistor M38 by current mirroring. The constant current I3 of the n-type transistor M38 is the operational current of the amplifier of the n-type difference pair Nd undergoing amplification.

Accordingly, as seen in FIG. 4(b), the amplifier of the p-type difference transistor pair Pd is in operation during time intervals i and limited during time intervals ii, in exactly the same way as in the amplifier shown in FIG. 4(a). On the other hand, the amplifier of the n-type difference transistor pair Nd is set in operation during time intervals iii and set inoperative during time intervals iv. Thus, the operational ranges of the p-type difference transistor pair Pd and n-type difference transistor pair Nd overlap each other in the range between the two limiting amplification levels V1 and V2, thereby coupling their amplification smoothly during the switching. The overlapping range is preferably narrower from the point of noise reduction in the frequency region associated with it.

It would be apparent to a man skilled in the art that the two transistors in the pair Pp can be replaced by one transistor, since the pair Pp has identical transistors in parallel.

It would be also apparent to a man skilled in the art that pnp-type and npn-type bipolar transistors may be used equally well in place of p-type and n-type transistors, respectively.

What is claimed is:

1. An amplifier, comprising;
   a first amplifier circuit having a difference pair of transistors having a first conduction-type (difference transistor pair of the first conduction-type) for amplifying an input signal to provide a first output signal
   a second amplifier circuit having a difference pair of transistors having a second conduction-type (difference transistor pair of the second condition-type) for amplifying said input signal to provide a second output signal, wherein
   only said first amplifier circuit is activated when the level of said input signal is lower than a predetermined level and said first and second amplifier circuits are activated when the level of said input signal is higher than said predetermined level; and
   said amplifier is adapted to output said first and second output signals in an integrated form.

2. An amplifier, comprising;
   a first amplifier circuit having a difference pair of transistor pair of the first conduction-type for amplifying an input signal to provide a first output signal
   a second amplifier circuit having a difference transistor pair of the second conduction-type for amplifying said input signal to provide a second output signal, wherein
   a controller adapted to activate said second a amplifier circuit when the level of said input signal is higher than a predetermined level and inactivate said second amplifier circuit when the level of said input signal is lower than said predetermined level; and
   an output circuit for outputting said first and second output signals in an integrated form.

3. The amplifier according to claim 2, wherein
   said controller is adapted to set up said predetermined level such that said level corresponds to the limiting amplification level of said first amplifier circuit.

4. The amplifier according to claim 3, wherein
   said controller has a switching transistor formed of the same type and the same size of transistors forming said first difference transistor pair, and is operable under the same operating conditions as said first difference pair; and wherein said second amplifier circuit is activated/inactivated in accordance with whether said switching transistor is switched on/off.

5. The amplifier according to claim 4, wherein said transistors forming said difference transistor pair of the first conduction-type are p-type MOSFETs while said transistors forming said difference transistor pair of the second conduction type are n-type MOSFETs.

6. The amplifier according to claim 4, wherein said transistors forming said difference transistor pair of the first conduction type are pnp-type bipolar transistors while said transistors forming said difference transistor pair of the second conduction type are npn-type bipolar transistors.

7. The amplifier according to claim 2, wherein said controller is adapted to set up said predetermined level below said limiting amplification level of said first amplifier circuit.

8. The amplifier according to claim 7, wherein said controller has a switching transistor formed of the same type and a different size of transistors forming said first difference transistor pair, and is operable under the same operating conditions as said first difference pair; and wherein said second amplifier circuit is activated/inactivated in accordance with whether said switching transistor is switched on/off.

9. The amplifier according to claim 8, wherein said transistors forming said difference transistor pair of the first conduction-type are p-type MOSFETs while said transistors forming said difference transistor pair of the second conduction-type are n-type MOSFETs.

10. The amplifier according to claim 8, wherein said transistors forming said difference transistor pair of the first conduction-type are pnp-type bipolar transistors while said transistors forming said difference transistor pair of the second conduction-type are npn-type bipolar transistors.

* * * * *